(12) United States Patent
Bitz et al.

(10) Patent No.: US 12,376,219 B2
(45) Date of Patent: Jul. 29, 2025

(54) CIRCUIT BOARD STRUCTURES FOR COMPONENT PROTECTION

(71) Applicant: Micron Technology, Inc., Boise, ID (US)

(72) Inventors: Bradley Bitz, Meridian, ID (US); João Elmiro da Rocha Chaves, Middleton, ID (US); Kristopher Hamrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 473 days.

(21) Appl. No.: 17/849,093

(22) Filed: Jun. 24, 2022

(65) Prior Publication Data

US 2023/0422388 A1    Dec. 28, 2023

(51) Int. Cl.
   *H05K 1/02*    (2006.01)

(52) U.S. Cl.
   CPC ... *H05K 1/0203* (2013.01); *H05K 2201/0999* (2013.01); *H05K 2201/10159* (2013.01)

(58) Field of Classification Search
   CPC ......... H05K 1/0203; H05K 2201/0999; H05K 2201/1059
   USPC ........................................................ 361/760
   See application file for complete search history.

(56) References Cited

U.S. PATENT DOCUMENTS

| | | | |
|---|---|---|---|
| 2007/0195505 A1* | 8/2007 | Savignac | H01L 25/18 361/719 |
| 2015/0271911 A1* | 9/2015 | Chen | H05K 1/0216 29/841 |
| 2021/0217482 A1* | 7/2021 | Choi | G11C 5/04 |
| 2022/0122958 A1* | 4/2022 | Nguyen | H01L 25/50 |

\* cited by examiner

*Primary Examiner* — Andargie M Aychillhum
(74) *Attorney, Agent, or Firm* — Holland & Hart LLP

(57) ABSTRACT

Methods, systems, and devices for circuit board structures for component protection are described. A memory system may be implemented on a circuit board, where one or more memory devices may be attached to the circuit board. Components for accessing the one or more memory devices may also be attached to the circuit board. The circuit board may also include one or more structures extending from the circuit board that are configured to shield the one or more memory devices, the components for accessing the one or more memory devices, or both, from forces.

25 Claims, 6 Drawing Sheets

CIRCUIT BOARD STRUCTURES FOR COMPONENT PROTECTION

FIELD OF TECHNOLOGY

The following relates to one or more systems for memory, including circuit board structures for component protection.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Some of the components attached to a circuit board for implementing a memory system may be positioned in areas that are susceptible to forces that may damage components, such as physical impact, shorting conditions, electrostatic discharge, electronic interference, thermal extremes, or the like. The susceptible areas may be located at an edge of the circuit board, a middle of the circuit board, or other areas of the circuit board. Moreover, as the form factor of such circuit boards shrinks, a likelihood that a component may be placed in a susceptible area may increase. Additionally, the varying heights of the different components on the circuit board may prevent a flat surface from being provided for application of a label—e.g., where an area of the label may be larger than an area of a largest component on the circuit board. Accordingly, a surface of a label attached to the circuit board may be non-uniform (e.g., may be indented, outdented, creased, etc.) and susceptible to damage.

To protect components of the memory system, improve a performance of the memory system, or both, structures may be attached to the circuit board that protect the components from forces. To provide support for applying a uniform label to a package, one or more of the structures may be configured to increase a size of a landing area for application of the label. In some examples, the label may be configured to provide additional protection against one or more of the forces.

Features of the disclosure are initially described in the context of a system that relates to circuit board structures for component protection. Features of the disclosure are also described in the context of circuit boards and protective structures. These and other features of the disclosure are further shown by and described in the context of a flowchart that relates to circuit board structures for component protection.

Figure 1:
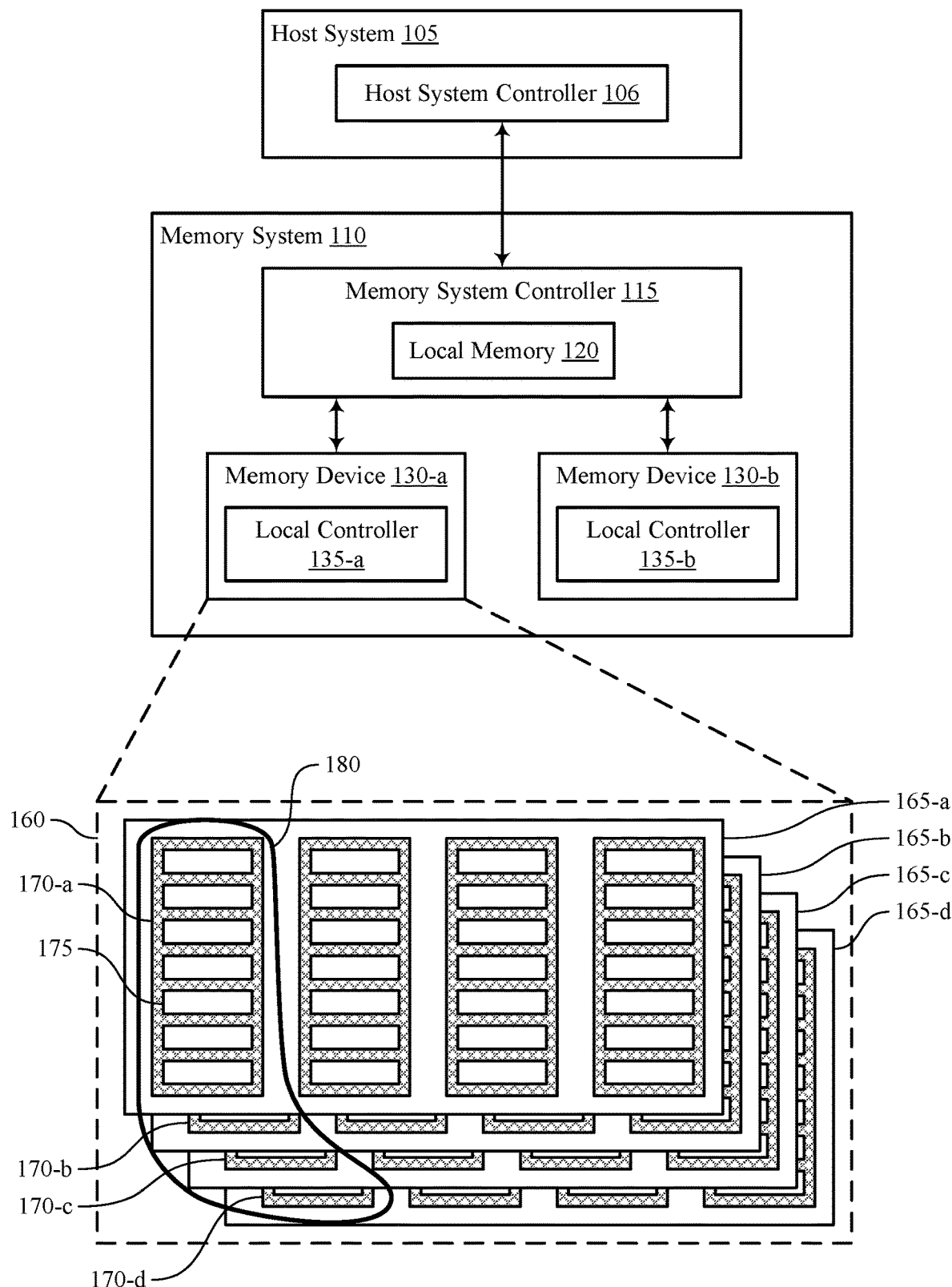
FIG. 1 shows an example of a system that supports circuit board structures for component protection in accordance with examples as disclosed herein.

FIG. 1 shows an example of a system 100 that supports circuit board structures for component protection in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices (memory device 130-a and memory device 130-b) are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval or manipulation (e.g., updating) by the host system 105 (e.g., with reduced latency relative to a memory device 130) in accordance with a cache policy.

Although the example of the memory system 110 in FIG. 1 has been shown as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as shown in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support circuit board structures for component protection. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

A circuit board may be configured with components (e.g., devices, connections, circuit elements, etc.) for implementing the memory system 110. In some examples, the components of the memory system 110 (e.g., the memory devices 130, controllers, circuit elements including resistors and capacitors, etc.) may be attached to the circuit board. In some examples, a label indicating information about the memory system 110 (e.g., a part number, stock keeping unit (SKU) number, etc.) may be attached (e.g., using an adhesive) to the circuit board—e.g., on top of one or more of the components of the memory system 110.

The circuit board may be configured in accordance with a particular package type. For example, the circuit board may be configured to have particular dimensions, with particular connectors, in accordance with component height (or z-height) limits, and the like. In some examples, the circuit board may be configured in accordance with an M.2 package, an mSATA package, a 2.5 inch SATA package, etc. The different package types may have different dimensions, height tolerances, etc. In some examples, a package type may include an enclosure that encompasses the circuit board (e.g., a 2.5 inch SATA package). Alternatively, a package type may leave the components of the circuit board exposed (e.g., an M.2 package).

Some of the components that are attached to the circuit board for implementing the memory system 110 may be positioned in an area that is susceptible to deleterious forces, such as physical impact, shorting conditions, electrostatic discharge, electronic interference, thermal effects, or the like. The susceptible areas may be located at an edge of the circuit board, a middle of the circuit board, or other areas of the circuit board. Moreover, as the form factor of such circuit boards shrinks, a likelihood that a component may be placed in a susceptible area may increase. Additionally, the varying heights of the different components on the circuit board may prevent a flat surface from being provided for application of a label—e.g., where an area of the label may be larger than an area of a largest component on the circuit board. Accordingly, a surface of a label attached to the circuit board may be non-uniform (e.g., may be indented, outdented, creased, etc.) and susceptible to damage.

To protect components of the memory system 110, improve a performance of the memory system 110, or both, structures may be attached to the circuit board that protect the components from deleterious forces. To provide support for applying a uniform label to a package, one or more of the structures may be configured to increase a size of a landing area for application of the label. In some examples, the label may be configured to provide additional protection against one or more of the deleterious forces.

In some examples, the memory system 110 is implemented on a circuit board, where the one or more memory devices 130 may be attached to the circuit board. Additionally, components for accessing the one or more memory devices (e.g., controllers, circuit elements, etc.) may be attached to (e.g., encased in) the circuit board. The circuit board may also include one or more structures extending from the circuit board that are configured to shield the one or more memory devices 130, the components for accessing the one or more memory devices, or both, from deleterious forces (such as physical impacts, electromagnetic interference, thermal extremes, etc.).

By configuring the circuit board with structures for protecting memory devices, components for accessing the memory devices, or both, a performance and operating life of the memory system may be improved. In some examples, the structures may also increase a structural integrity of the circuit board itself—e.g., by stiffening vulnerable portions of the circuit board prevent breakage, warpage, or both. Additionally, the structures may be used to provide attachment points for a label and to provide a increased landing area for the label (e.g., in conjunction with a memory device).

Although described in the context of NAND technology, the concepts described herein may similarly be applied to other types of memory technologies that are implemented on a circuit board. For example, such structures may similarly be used to protect vulnerable components on a circuit board used to implement a DRAM device (e.g., a circuit board configured in accordance with a DDRx package), an FeRAM device (e.g., in accordance with a DDRx package), a chalcogenide device (e.g., in accordance with an M.2 package), and the like.

Figure 2A:
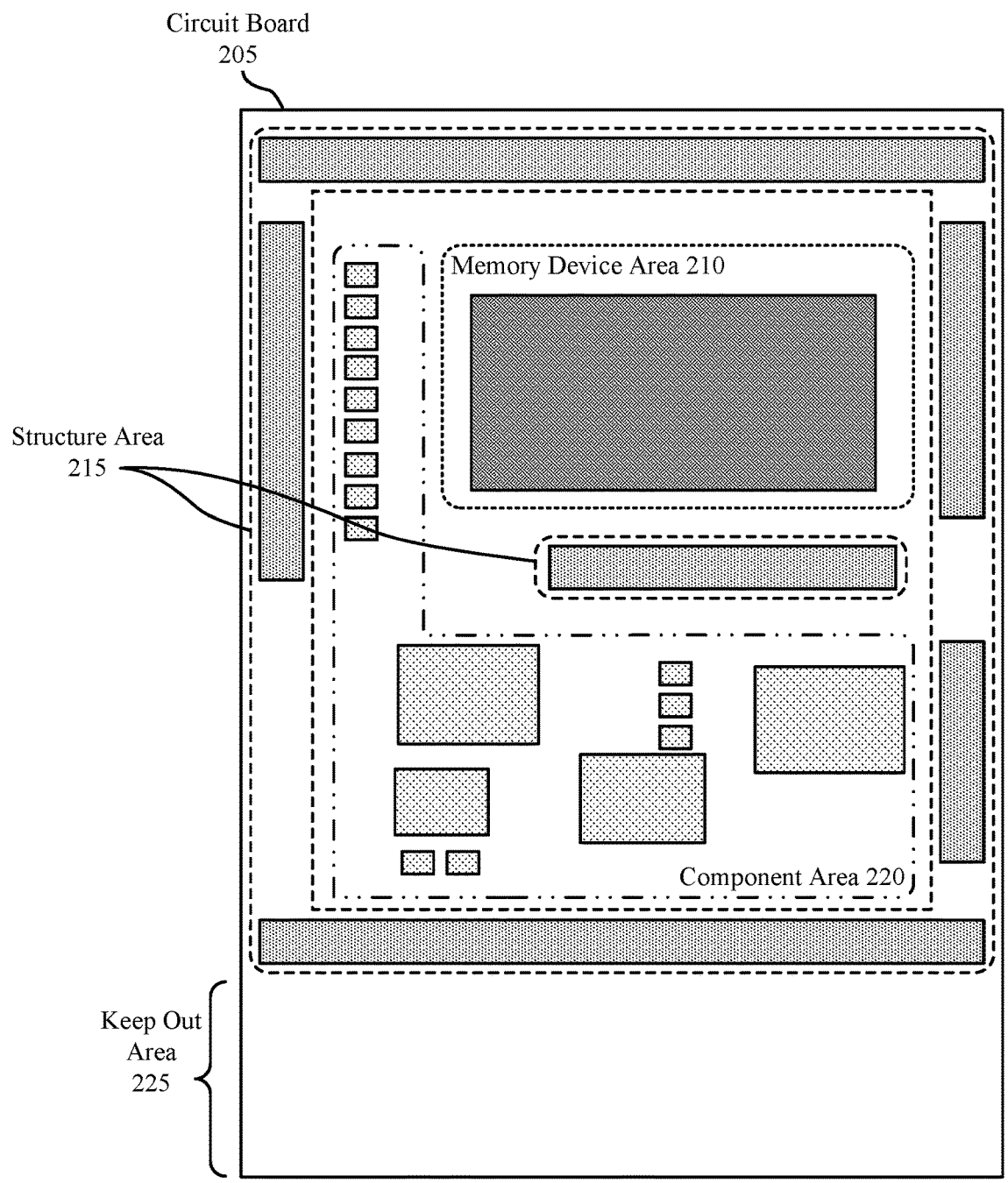
FIGS. 2A through 2C show views of an example of a physical configuration of a memory system that includes structures for protecting components of a memory system in accordance with examples as disclosed herein.

FIG. 2A shows a top view of an example of a physical configuration of a memory system that includes structures for protecting components of a memory system in accordance with examples as disclosed herein.

The circuit board 205 may support the operation of the memory system 200 (which may be an example of the memory system 110 of FIG. 1). The circuit board 205 may include a substrate (e.g., an FR-4 substrate) for a conductive material that provides conductive paths (e.g., buses, signal traces, etc.) for connecting the components 240 and conductive planes (e.g., power or ground planes) as well as for solder pads that are connected to the conductive material and provide attachment points for the components 240. In some examples, the dimensions of the circuit board are configured in accordance with a package type (e.g., a 2.5 inch SATA package, an mSATA package, an M.2 package, a DDRx package, etc.). The circuit board 205 may include the memory device area 210 where one or more memory devices (e.g., such as the memory device 230) may be attached; the structure area 215 where one or more structures (e.g., such as the structures 235) may be attached; the component area 220 where one or more components (e.g., such as the components 240) may be attached; and the keep out area 225 where no components (or a limited quantity of components) may be attached. In some examples, the keep out area 225 is omitted from the circuit board 205.

The memory device area 210 may be configured for the attachment of one or more memory devices (e.g., the memory device 230). For example, the memory device area 210 may include solder pads (e.g., an array of surface-mount solder pads) for attaching one or more memory devices (e.g., including the memory device 230). In some examples, the memory device area 210 may be discontinuous—e.g., one portion of the memory device area 210 may be positioned at a first portion of the circuit board 205 and configured for attaching a first memory device and a second portion of the memory device area 210 may be positioned at a physically separated second portion of the circuit board 205 and configured for attaching a second memory device. The memory device 230 may be an example of a memory device 130 of FIG. 1. In some examples, the memory device 230 may be a DRAM device, an FeRAM device, or a chalcogenide memory device.

The component area 220 may be configured for attachment of the components 240. For example, the memory device area 210 may include solder pads (e.g., through-hole solder pads, surface-mount solder pads) for attaching the components 240. In some examples, the component area 220 may be discontinuous. For example, the component area 220 may include two or more physically separated areas—e.g., separated by the memory device area 210, the structure area 215, or both. The components 240 may include components for accessing a memory device, which may include active components (such as a memory controller and a voltage regulator) as well as passive components (such as resistors, capacitors, etc.). In some examples, a subset of the components 240 may be placed in an area that is susceptible to deleterious forces (e.g., physical impacts, interference, temperature increases). For example, a subset of the components 240 may be placed near an edge of the circuit board 205—e.g., within a first distance from the edge of the circuit board 205. The subset of the components 240 may be susceptible to physical impacts, electrostatic discharge, shorting conditions, or a combination thereof—e.g., caused by handling or dropping the circuit board 205.

The structure area 215 may be configured to support the presence of the structures 235. In some examples, the structures 235 are built up from the circuit board 205 within the structure area 215. The structures 235 may be built up using a similar or same epoxy laminate material (e.g., an FR-4 epoxy) as the circuit board 205. In some examples, the structures 235 are integrally formed with (e.g., formed at a same time as and as part of) the circuit board 205—e.g., the structures 235 may be formed as part of the substrate used as a foundation for the conductive material within the circuit board 205. For example, a single epoxy layer used to form the substrate of the circuit board 205 may also be used to form the structures 235.

In some examples, the structure area 215 is configured for attachment of the structures 235. For example, the memory device area 210 may include solder pads (e.g., through-hole solder pads, surface-mount solder pads), sockets, jacks, press-fit holes, threaded holes, or the like, for attaching the structures 235. In other examples, the memory device area 210 may be a flat or textured surface for attaching the structures 235 (e.g., using an adhesive). The structure area 215 may be discontinuous. For example, the structure area 215 may include areas that extend along the edges of the circuit board 205 as well as one or more areas within an interior portion of the circuit board 205. In some examples, one or more portions of the structure area 215 may be omitted (e.g., the bottom-most structure area). The structures 235 may be composed of a non-conductive material (e.g., plastic or FR-4). The structures 235 may form walls that protect neighboring components (e.g., a memory device or component) from impact. Additionally, the structures 235 may include a portion that extends from a wall portion to form a ceiling above one or more of the neighboring components. Additional details related to the configuration and composition of the structures 235 are described in more detail herein, including with reference to FIGS. 3A through 3D.

As depicted in FIG. 2A, a structure may extend across a portion of the structure area 215 (e.g., as shown by the top-most structure, middle structure, and bottom-most structure). As also depicted in FIG. 2A, a structure may partially extend across a portion of the structure area 215 (e.g., as shown by the left-most structure). In some examples, one or more structures extend across respective portions of the structure area 215 that corresponds to vulnerable components located near an edge of the circuit board 205 (e.g., as shown by the left-most structure and bottom-right structure). In such cases, the one or more structures may protect the vulnerable components from deleterious forces. In some cases, a gap between one or more structures may be configured to accommodate a component having a height that exceeds a threshold.

As also depicted in FIG. 2A, structures may be positioned on either side of the memory device 230. In such cases, the structures and the memory device 230 may be used together to provide a surface for the application of a label. In some examples, the structures 235 may extend fully (or nearly fully) along the edges of the circuit board. In such cases, a label may be attached to tops of the structures 235 that fully enclose the memory device 230 and the components 240. In a similar example, one or more of the structures 235 may be omitted such that the label partially encloses the memory device 230 and the components. Additional details related to the label are described in more detail herein, including with reference to FIGS. 2B and 2C.

As also depicted in FIG. 2A, a structure may be positioned in an interior of the circuit board 205. Such a structure may protect vulnerable components (e.g., components with heights that exceed a threshold) or important components (e.g., the memory device 230) from impact. Additionally, or alternatively, the structure positioned in the interior of the circuit board 205 may be used to strengthen and/or stiffen the circuit board—e.g., to prevent warping. The structures positioned along the edges of the circuit board may also be used to strengthen and/or stiffen the circuit board. In some cases, heights of structures, components, and devices may be configured to be below an upper limit of a height specified for such circuit boards. The structures 235 may be configured to be less than or equal to the upper limit of the height specified for such circuit boards.

FIG. 2A depicts a possible configuration of the memory device 230, the structures 235, and the components 240. Other configurations are possible. For example, although the structures 235 are shown in each portion of the structure area 215, one or more of the structures 235 may be omitted (e.g., the bottom-most structure, the perimeter structures, etc.)—e.g., a single structure may be attached to the circuit board 205. Also, one or more of the structures 235 may be repositioned. And additional structures may be included on the circuit board 205. Similarly, the locations of the memory device 230 and the components 240 may be rearranged. Also, different configurations may be possible. For example, multiple memory devices may be attached to the circuit board, additional or fewer components may be attached to the circuit board, and the like.

Figure 2B:
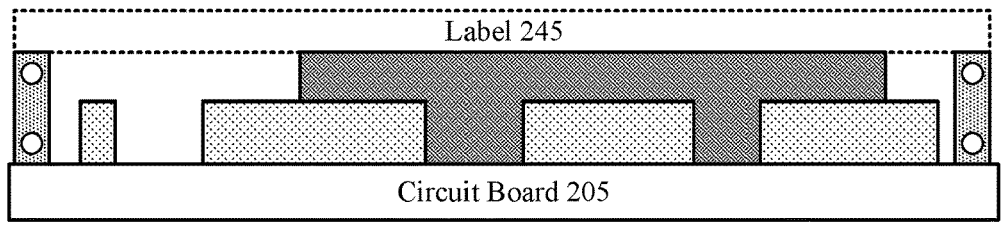

FIG. 2B shows a front view of an example of a physical configuration of memory system that includes structures for protecting components of a memory system in accordance with examples as disclosed herein.

FIG. 2B depicts a front view of the memory system 200 of FIG. 2A in an example where the structures 235-b are used. The structures 235-b may be of a first type that forms an upright portion (which may be referred to as a wall). In some examples, the structures 235-b include one or more cavities. The cavities may extend through the structures 235-b. In some examples, rods (e.g., rods made of a stiff material, such as a metallic material) may be inserted through the cavities to stiffen the structures 235-b, strengthen the structures 235-b, or both.

The label 245 may be attached to a top of the structures 235-b as well as a top of the memory device 230. The structures 235-b may provide support for the ends of the label 245. The structures 235-b may also be configured to have a height that is commensurate with the height of the memory device 230 (or other component), such that a top of the structures 235-b may be aligned with the top of the memory device 230. Accordingly, the structures 235-b and the memory device 230 may provide a surface on which the label 245 may lie substantially flat. In some examples, the label 245 is configured to protect memory system 200 from deleterious forces. For example, the label 245 may include a shock-absorbent material used to absorb physical impact in the event that the memory system 200 is dropped or otherwise mishandled. Additionally, or alternatively, the label 245 may include a conductive material (e.g., copper) used to shield the memory system 200 from electromagnetic disturbance. Additionally, or alternatively, the label 245 may be configured to dissipate heat generated by the memory system. For example, the label 245 may be configured with a thermally conductive material and an increased surface area (e.g., by configuring the label 245 with multiple protrusions).

In some examples, the label 245 may be attached using an adhesive. In some examples, the adhesive may also provide evidence of tampering with the memory system 200 if the label 245 is removed. Additionally, or alternatively, the label 245 may include protrusions (e.g., plugs) that may be attached to receiving ports (e.g., jacks, sockets, press-fit holes, threaded holes, indentations) configured on a top portion of the structures 235-b. In some examples, the receiving ports may be configured so that removal of the label 245 would provide evidence of tampering with the memory system 200—e.g., the label 245 may not be removable without damage to plugs of the label 245.

Additionally, or alternatively, the label 245 may be attached using solder. In some examples, the solder may be used to create a thermal connection between the label 245 and the structures 235-b. In such cases, the structures 235-b may also be configured to dissipate heat. For example, a core of the structures 235, an exterior of the structures 235, or both may be composed of a thermally conductive material. In similar examples that do not use solder, the connectors of the label 245 and the structures 235-b may be configured to form the thermal connection.

Figure 2C:
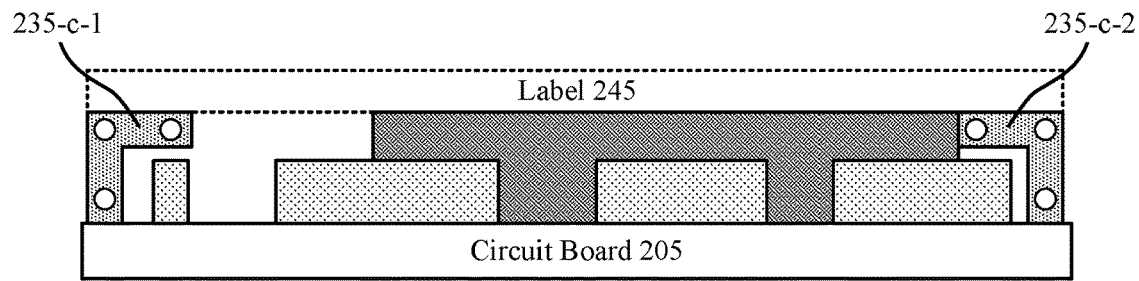

FIG. 2C shows a front view of an example of a physical configuration of a memory system that includes structures for protecting components of a memory system in accordance with examples as disclosed herein.

FIG. 2C depicts an alternative (relative to FIG. 2B) front view of the memory system 200 of FIG. 2A in an example where the structures 235-c are used. The structures 235-c may be of a second type that forms an upright portion (which may be referred to as a wall) and an upper portion (which may be referred to as a shelf, an awning, a cantilevered portion, a ceiling, or the like) that extends from an upright portion of the structures 235-c—e.g., over a top of one or more of the components 240.

The structures 235-c may be similarly configured as the structures 235-b as described with reference to FIG. 2B—e.g., the structures may be configured to with similar materials, similar connection points, etc. Also, the label 245 may be attached to the structures 235-c, as similarly described with reference to FIG. 2B. That said, the structures 235-c may provide a larger landing area for the label 245 than the structures 235-b of FIG. 2B. In some examples, the upper portion of the left-most structure 235-c–1 may extend further than the upper portion of the right-most structure 235-c–2. For example, the left-most structure 235-c–1 may extend to be in contact with the side of the memory device 230. In such cases, the structures 235-c and the memory device 230 may provide a continuous (or nearly continuous) and uniform (or nearly uniform) surface for application of the label 245.

Figure 3A:
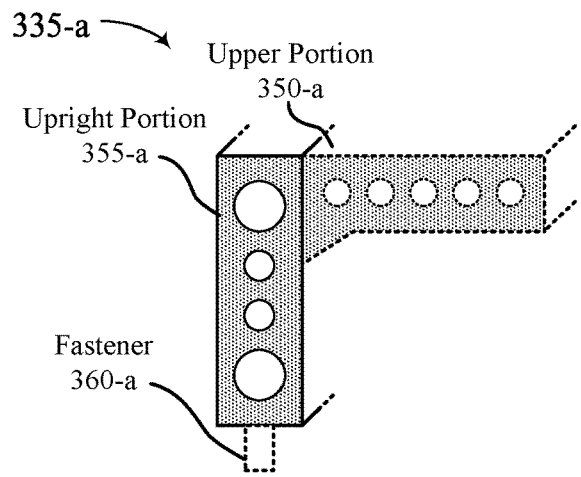
FIGS. 3A through 3D show views of an example of a structure for protecting components of a memory system in accordance with examples as disclosed herein.

FIG. 3A shows a front view of an example of a structure for protecting components of a memory system in accordance with examples as disclosed herein.

The structure 335-a may be an example of a structure as described with reference to FIGS. 2A through 2C. The structure 335-a may include an upright portion 355-a. The structure 335-a may also include one or both of the fastener 360-a and the upper portion 350-a that extends (e.g., orthogonally) from the upright portion 355-a. In some examples, cavities are included in one or both of the upright portion 355-a and the upper portion 350-a. The cavities may reduce material usage and, in some examples, may provide a receiving channel for one or more rods to extend through the structure 335-a. Among other examples, the fastener 360-a may be a rod that is press-fit into a hole of a circuit board, a screw that is screwed into a threaded hole of the circuit board, a metal rod that is soldered to the circuit board, a plug that is plugged into a socket of the circuit board.

In some examples, the upper portion 350-a may include a thermally conductive material and may be configured to dissipate heat generated by a memory system. In some examples, the upper portion 350-a may include ports for coupling the thermally conductive material of the upper portion 350-a with a label that is attached to the upper portion 350-a. Similarly, the top of the upright portion 355-a may include a thermally conductive material and include ports for thermally coupling with the label.

Figure 3B:
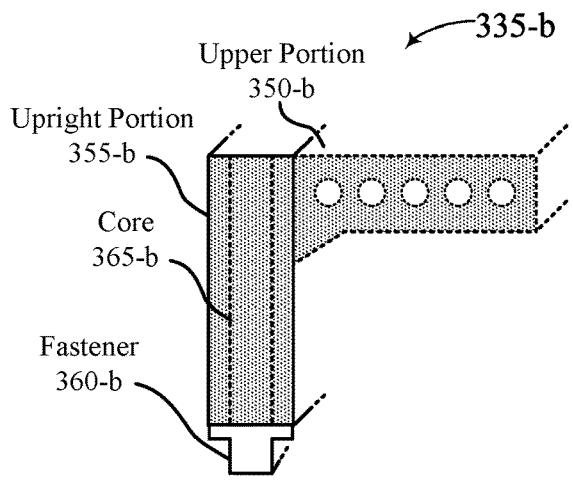

FIG. 3B shows a front view of an example of a structure for protecting components of a memory system in accordance with examples as disclosed herein.

The structure 335-b may be similarly configured as the structure 335-a of FIG. 3A. However, instead of including cavities, the structure 335-b may include the stiffened core 365-b that extends through the upright portion 355-b of the structure 335-b. The stiffened core 365-b may be a metallic material, a hardened plastic material, or other material with a Young's modulus that exceeds a threshold. In some examples, the stiffened core 365-b includes a material that has a higher Young's modulus than a Young's modulus of other materials of the structure 335-b (such as the materials that form an upper portion 335-b). In some examples, the stiffened core 365-b includes a thermally conductive material. The stiffened core 365-b may be coupled with the fastener 360-b. In some examples, the stiffened core 365-b and the fastener 360-b may be formed as a single piece. The fastener 360-b may be made of a material that can be soldered to a circuit board. In some examples, the fastener 360-b extends along the structure 335-b and acts as a stiffener for the circuit board.

Figure 3C:
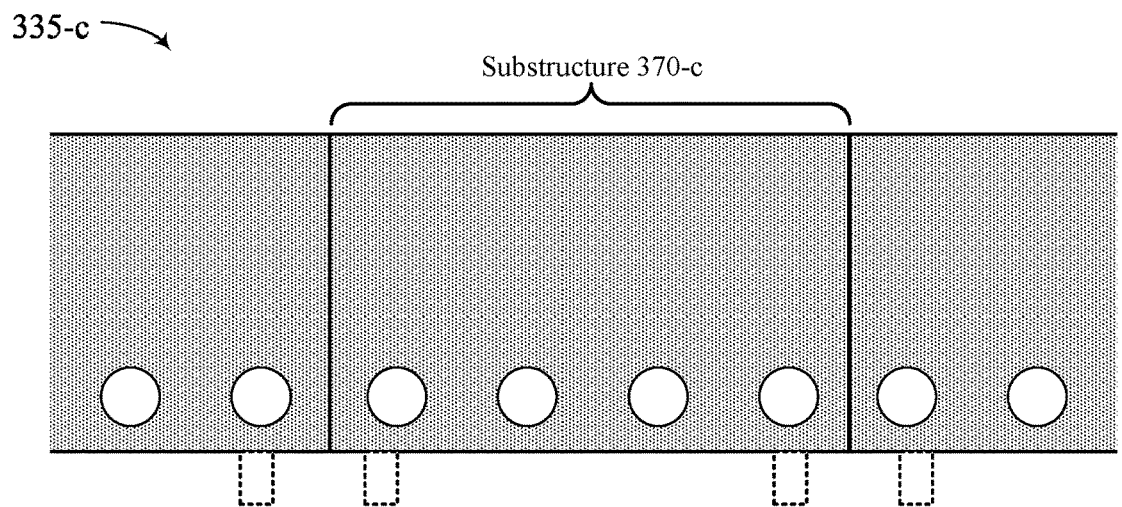

FIG. 3C shows a side view of an example of a structure for protecting components of a memory system in accordance with examples as disclosed herein.

The structure 335-c may be an example of the structure 335-a of FIG. 3A or the structure 335-b of FIG. 3B. The structure 335-c may be modularly formed using one or more substructures (such as the substructure 370-c). The substructures may be of one or varying lengths and may be coupled together (by connectors, by a rod that passes through the substructures, adhesive, etc.) to form the structure 335-c. In some examples, different substructures may have different heights. By using the substructures, a length of the structure 335-c may be varied—e.g., to adhere to the dimensions of a circuit board, to span a vulnerable area of a circuit board etc. As similarly described with reference to the front of the structure 335-a FIG. 3A, a side of the structure 335-c may include one or more cavities—e.g., to conserve material.

Figure 3D:
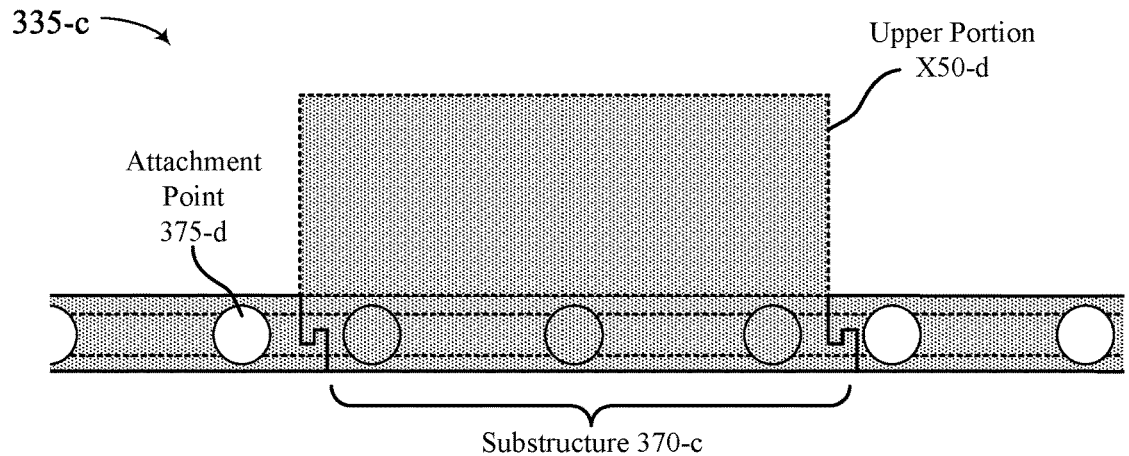

FIG. 3D shows a top view of an example of a structure for protecting components of a memory system in accordance with examples as disclosed herein.

The structure 335-c may be an example of the structure 335-c of FIG. 3C. The structure 335-c may be formed using one or more substructures (such as the substructure 370-c). In some examples, different types of substructures are connected together. For example, a first substructure with an upper portion (e.g., the substructure 370-c) may be connected to substructures that do not include upper portions. In some examples, the substructure 370-c is positioned adjacent to a memory device and, thus, is used to form, with the memory device, a surface for attaching a label. In some examples, the substructure to the right of the substructure 370-c does not include an upper portion—e.g., to accommodate a component with a height that exceeds a threshold.

In some examples, the top of structure 335-c includes attachment points (such as the attachment point 375-d) for attaching upper portions to the upright portions of the structure 335-c, or vice versa. Among other options, the attachment points may be recesses, threaded recesses, holes, threaded holes, or plugs. In some examples, the upper portions may include protrusions that couple with the recesses or holes (e.g., by way of a press-fit or interference-fit). In other examples, the upper portions include holes that line up with the holes or recesses of the upright portions such that a rod (e.g., a dowel) or screw may be passed through the holes to couple with the attachment points.

In some examples, the attachment points are configured to couple a thermally conductive material in an upper portion of the structure 335-c with a thermally conductive material in an upright portion of the structure 335-c. Additionally, or alternatively, the attachment points may be configure to couple a thermally conductive label attached to a top of the structure 335-c with a thermally conductive material in an upright portion of the structure 335-c, an upper portion of the structure 335-c, or both.

Figure 4:
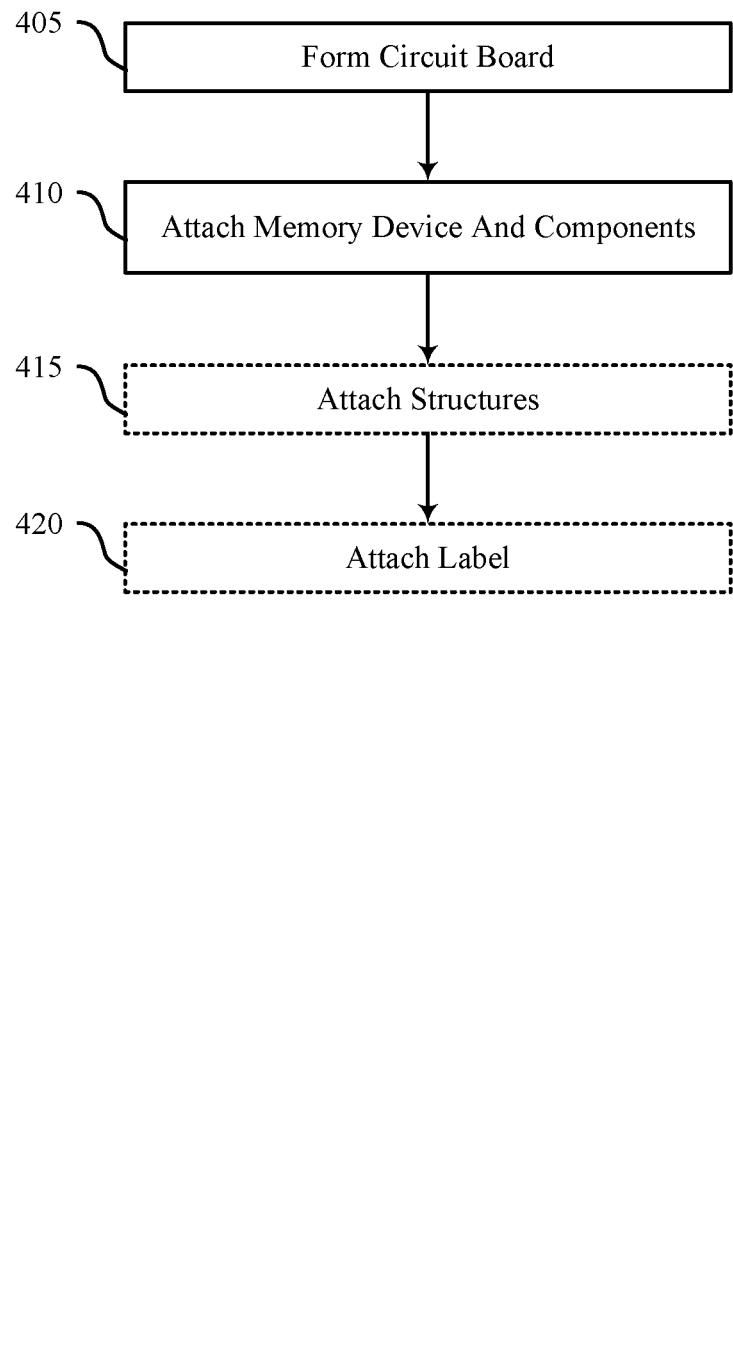
FIG. 4 shows an example of a set of operations that supports manufacturing a circuit board that supports structures for protecting components of a memory system in accordance with examples as disclosed herein.

FIG. 4 shows an example of a set of operations for manufacturing a circuit board that supports structures for protecting components of a memory system in accordance with examples as disclosed herein.

The flowchart 400 shows an example set of operations performed to manufacture a memory system that includes structures for protecting components of a memory system. For example, the flowchart 400 may include operations for forming a circuit board with attached structures for protecting components for accessing the memory system, to support the attachment of structures for protecting the components for accessing the memory system, or both.

Aspects of the flowchart 400 may be implemented by a controller, among other components. Additionally, or alternatively, aspects of the flowchart 400 may be implemented as instructions stored in memory (e.g., firmware stored in a memory coupled with a controller). For example, the instructions, when executed by a controller, may cause the controller to perform the operations of the flowchart 400.

One or more of the operations described in the flowchart 400 may be performed earlier or later, omitted, replaced, supplemented, or combined with another operation. Also, additional operations described herein may replace, supplement, or be combined with one or more of the operations described in the flowchart 400.

At 405, a circuit board (e.g., such as the circuit board 205 of FIGS. 2A through 2C) may be formed. Forming the circuit board may include forming a substrate (e.g., of an epoxy material, such as FR-4) as a supporting structure for circuit traces and a soldermask. In some examples, the substrate is formed to include raised structures (e.g., the structures 235 of FIGS. 2A through 2C) that extend from a base of the substrate. The location of the structures may be based on a circuit layout configured for the circuit board—e.g., the location of the structures may be determined based on a position of components in the circuit layout that are likely to be susceptible to physical impact, electronic interference, or other deleterious forces.

Forming the circuit board may also include etching away portions of a copper plate attached to the substrate to form conductive traces that provide signal paths between components of a memory system as well as conductive pads for connecting components of the memory system to the circuit board and the conductive traces. Based on the etching, an areas for memory devices and components may be formed.

Additionally, forming the circuit board may include applying a soldermask on top of the substrate, structures, and conductive traces (leaving the conductive pads exposed) and, in some examples, applying a silk screen on top of the soldermask.

In some examples, forming the circuit board includes drilling holes through the layers of the circuit board—e.g., to support through-hole circuit elements. The holes drilled in the circuit board may also be used to support the attachment of structures for protecting components of the memory system—e.g., instead of or in addition to the raised structures formed as part of the substrate. In some examples, forming the circuit board includes texturing a surface of the circuit board to support the adhesion of structures to the circuit board during attachment.

At 410, one or more memory devices (e.g., the memory device 230 of FIGS. 2A through 2C) and components (e.g., the components 240 of FIGS. 2A through 2C) for accessing the one or more memory devices may be attached (e.g., soldered) to the circuit board (e.g., using the exposed conductive pads).

At 415, one or more structures (e.g., the structures described with reference to FIGS. 3A through 3D) for protecting one or both of the memory devices and components may be attached to the circuit board—e.g., instead of or in addition to the structures formed as part of the circuit board. The one or more structures may be attached to the circuit board using an adhesive (e.g., to a textured area of the circuit board) or solder (e.g., using through-hole or surface mount solder techniques). Additionally, or alternatively, pegs on the bottom of the one or more structures may be press fit into the board (e.g., using through-hole drilled into the circuit board). Additionally, or alternatively, the one or more structures may be screwed into the circuit board. Additionally, or alternatively, plugs on the bottom of the one or more structures may be plugged into sockets in the circuit board.

In some examples, the one or more structures may be attached to the circuit board using modular substructures (e.g., the substructure 370-c as described with reference to FIGS. 3C and 3D) that may be connected together, where a set of connected modular substructures may form a structure. In some examples, different types of substructures (e.g., substructures of varying heights, substructures of varying lengths, substructures that include an upper portion, substructures that omit an upper portion, etc.) may be connected together to form a single structure.

At 420, a label (e.g., the label 245 as described with reference to FIGS. 2B and 2C) may be attached to the one or more structures extending from the circuit board. The label may be attached to the one or more structures using an adhesive or solder. Additionally, or alternatively, pegs on the bottom of the label may be press fit into the top of the one or more structures. Additionally, or alternatively, the label may be fastened to the top of the one or more structures using screws or nails. Additionally, or alternatively, plugs on the bottom of the label may be plugged into sockets in the tops of the one or more structures. In some examples, the attachment point between the label and the structure may thermally couple the label with the structure, as described herein. In some examples, the label is attached to the one or more structures and a memory device. In some examples, the label and the one or more structures form a partial or full enclosure around the memory device and components.

Figure 5:
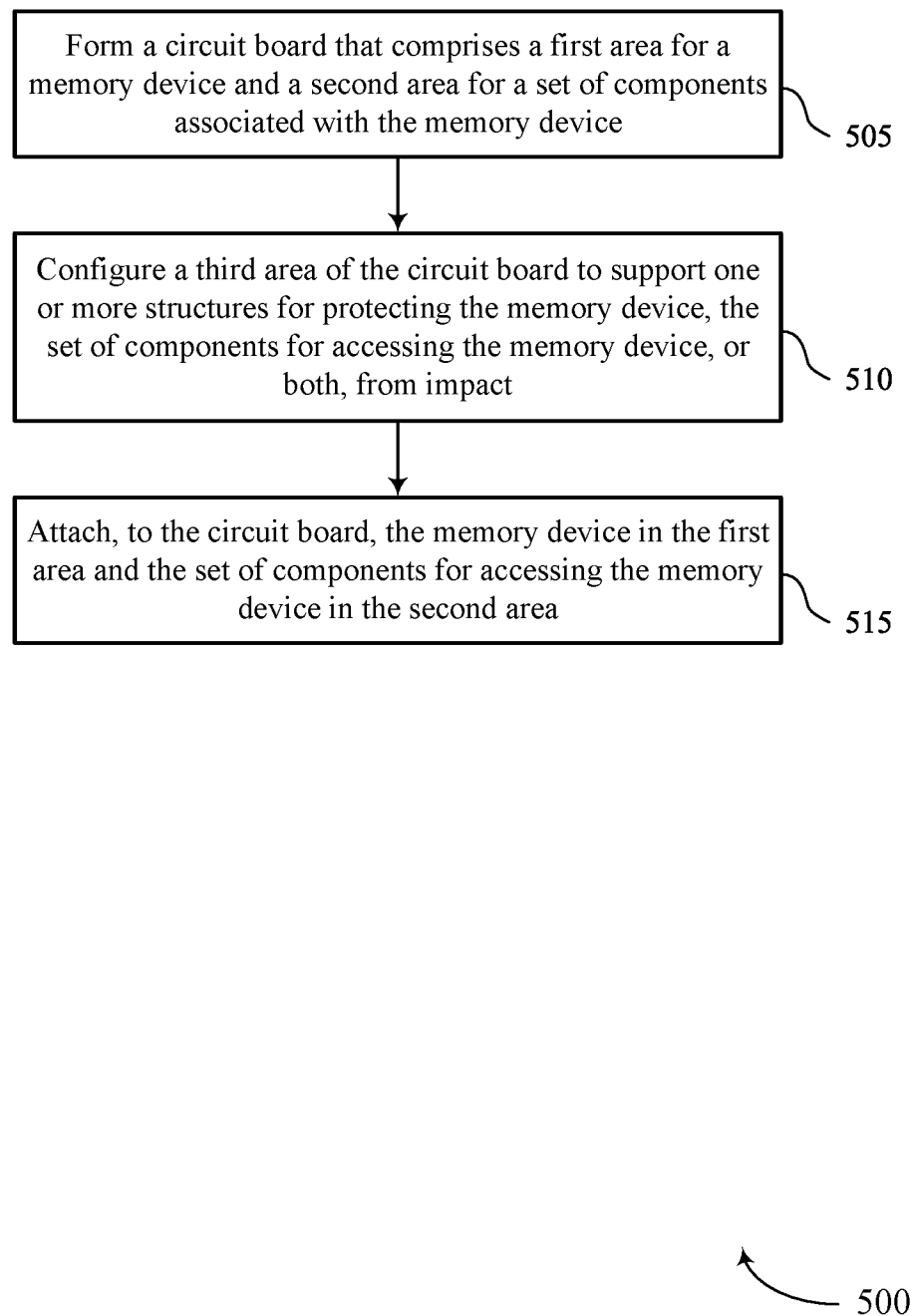
FIG. 5 shows a flowchart illustrating a method or methods that support circuit board structures for component protection in accordance with examples as disclosed herein.

FIG. 5 shows a set of operations illustrating a method 500 that supports the manufacture of circuit board structures for component protection in accordance with examples as disclosed herein. The operations of method 500 may be implemented by a manufacturing facility that includes manufacturing equipment and operators at the manufacturing facility.

At 505, the method may include forming a circuit board that includes a first area for a memory device and a second area for a set of components associated with the memory device. The operations of 505 may be performed in accordance with examples as disclosed herein.

At 510, the method may include configuring a third area of the circuit board to support one or more structures for protecting the memory device, the set of components for accessing the memory device, or both, from impact. The operations of 510 may be performed in accordance with examples as disclosed herein.

At 515, the method may include attaching, to the circuit board, the memory device in the first area and the set of components for accessing the memory device in the second area. The operations of 515 may be performed in accordance with examples as disclosed herein.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a circuit board that includes a first area for a memory device and a second area for a set of components associated with the memory device; configuring a third area of the circuit board to support one or more structures for protecting the memory device, the set of components for accessing the memory device, or both, from impact; and attaching, to the circuit board, the memory device in the first area and the set of components for accessing the memory device in the second area.

Aspect 2: The method, apparatus, or non-transitory computer-readable medium of aspect 1 where forming the circuit board includes forming a laminate layer of the circuit board, where forming the laminate layer of the circuit board includes building up the laminate layer in the third area to form the one or more structures.

Aspect 3: The method, apparatus, or non-transitory computer-readable medium of any of aspects 1 through 2, further including operations, features, circuitry, logic, means, or instructions, or any combination thereof for attaching, to the circuit board, the one or more structures in the third area.

Aspect 4: The method, apparatus, or non-transitory computer-readable medium of aspect 3 where attaching the one or more structures to the circuit board includes operations, features, circuitry, logic, means, or instructions, or any combination thereof for guiding pins of the one or more structures through holes in a first side of the circuit board and soldering the pins to an opposite side of the circuit board.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 5: An apparatus, including: a circuit board; a memory device coupled with the circuit board; components for accessing the memory device that are coupled with the circuit board; and a structure extending from the circuit board and configured to shield the memory device, the components for accessing the memory device, or both, from impact.

Aspect 6: The apparatus of aspect 5, where: a component of the components is positioned a first distance from an edge of the circuit board, and the structure is positioned a second distance from the edge of the circuit board, the second distance being smaller than the first distance, where the structure is configured to shield the component from impact.

Aspect 7: The apparatus of any of aspects 5 through 6, where: a second structure extends from the circuit board and is configured to shield the memory device, the components, or both from impact, the structure extends along a first edge of the circuit board, and the second structure extends along a second edge of the circuit board, the second edge of the circuit board opposing the first edge.

Aspect 8: The apparatus of aspect 7, where: a third structure extends from the circuit board and is configured to shield the memory device, the components, or both from impact, the third structure extends along a third edge of the circuit board.

Aspect 9: The apparatus of aspect 8, where: a fourth structure extends from the circuit board and is configured to shield the memory device, the components, or both from impact, and the fourth structure is positioned between the third edge of the circuit board and a fourth edge of the circuit board, where the fourth structure extends in a direction that extends from the first edge of the circuit board to the second edge of the circuit board, and where a portion of the circuit board is stiffened based at least in part on a position of the fourth structure.

Aspect 10: The apparatus of any of aspects 5 through 9, where a height of the structure is greater than or equal to a height of the memory device, the components for accessing the memory device, or both, based at least in part on building up a laminate layer in a third area.

Aspect 11: The apparatus of any of aspects 5 through 10, where: a second structure extends from the circuit board and is configured to shield the memory device, the components, or both from impact, and the apparatus further includes a label connected to a top of the structure and a top of the second structure, the label covering at least a portion of the memory device, at least a portion of the components for accessing the memory device, or both.

Aspect 12: The apparatus of aspect 11, where: the label includes an electrically-conductive material, a thermally-conductive material, or both.

Aspect 13: The apparatus of any of aspects 11 through 12, where: the label includes one or more protrusions configured to dissipate thermal energy generated by the memory device, thermal energy generated by the components for accessing the memory device, or both.

Aspect 14: The apparatus of any of aspects 11 through 13, where: the label includes a first thermally-conductive material, and the structure includes a second thermally-conductive material, where the first thermally-conductive material of the label is coupled with the second thermally-conductive material of the structure based at least in part on the label being connected to the top of the structure, and where the second thermally-conductive material of the structure is configured to dissipate thermal energy generated by the memory device, thermal energy generated by the components for accessing the memory device, or both.

Aspect 15: The apparatus of any of aspects 5 through 14, where: the structure at least a portion of the circuit board are formed by an integrally-formed layer of laminate material.

Aspect 16: The apparatus of any of aspects 5 through 15, where: the structure is composed of an insulative material and is attached to the circuit board via one or more first pins of the structure that are soldered to the circuit board, via one or more second pins of the structure that are press-fit into receiving holes of the circuit board, via one or more screws that pass through the structure and are screwed into or bolted to the circuit board, via one or more jacks that are plugged into one or more plugs that are coupled with the circuit board, or any combination thereof.

Aspect 17: The apparatus of any of aspects 5 through 16, where: the structure includes an insulative material including a first stiffness and a second material that is at least partially encapsulated by the insulative material and including a second stiffness greater than the first stiffness; and the structure, the circuit board, or both, are stiffened by the second material.

Aspect 18: The apparatus of any of aspects 5 through 17, where: the structure includes a plurality of substructures that are detachably connected to one another to form the structure.

Aspect 19: The apparatus of aspect 18, where the plurality of substructures includes: a first set of substructures configured to form a first portion of a wall; and a second set of substructures configured to form a second portion of the wall and a covering that extends orthogonally from the wall.

Aspect 20: The apparatus of any of aspects 5 through 19, where: a portion of the structure extends over a component of the components, the portion of the structure configured to protect the component from impact.

Aspect 21: The apparatus of any of aspects 5 through 20, further including: a case that encapsulates the circuit board, the memory device, the components for accessing the memory device, and the structure.

An apparatus is described. The following provides an overview of aspects of the apparatus as described herein:

Aspect 22: An apparatus, including: a circuit board; a memory device coupled with the circuit board; components for accessing the memory device that are coupled with the circuit board; a first structure extending from the circuit board; a second structure extending from the circuit board; and a label coupled with the first structure and the second structure, where the label covers the memory device, the components for accessing the memory device or both.

Aspect 23: The apparatus of aspect 22, further including: a third structure extending from the circuit board; and a fourth structure extending from the circuit board and opposing the third structure, where the label is coupled with the third structure and the fourth structure, and where the first structure, the second structure, the third structure, the fourth structure, and the label enclose the memory device and the components for accessing the memory device.

Aspect 24: The apparatus of aspect 23, further including: a fifth structure extending from the circuit board, where the fifth structure extends in a direction that extends from the first structure to the second structure, the first structure opposing the second structure, where the fifth structure is positioned between the third structure and the fourth structure, and where a structural strength of an enclosure formed by the first structure, the second structure, the third structure, the fourth structure, and the label is increased by the fifth structure.

Aspect 25: The apparatus of any of aspects 22 through 24, where: a height of the first structure and a height of the second structure exceeds a height of the memory device and heights of the components.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may show signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) may not be absolute but is close enough to achieve the advantages of the characteristic.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a circuit board;
   a memory device coupled with the circuit board;
   components for accessing the memory device that are coupled with the circuit board; and
   a structure extending from the circuit board and configured to shield the memory device, the components for accessing the memory device, or both, from impact, wherein:
   the circuit board comprises a first area for the memory device, a second area for the components for accessing the memory device, and a third area configured to support one or more structures for protecting the memory device, the components for accessing the memory device, or both, from impact, and
   the memory device is positioned with the first area, the components for accessing the memory device are positioned within the second area, and the structure is positioned within the third area.

2. The apparatus of claim 1, wherein:
   a component of the components is positioned a first distance from an edge of the circuit board, and
   the structure is positioned a second distance from the edge of the circuit board, the second distance being smaller than the first distance, wherein the structure is configured to shield the component from impact.

3. The apparatus of claim 1, wherein:
   a second structure extends from the circuit board and is configured to shield the memory device, the components, or both from impact,
   the structure extends along a first edge of the circuit board, and
   the second structure extends along a second edge of the circuit board, the second edge of the circuit board opposing the first edge.

4. The apparatus of claim 3, wherein:
   a third structure extends from the circuit board and is configured to shield the memory device, the components, or both from impact, and
   the third structure extends along a third edge of the circuit board.

5. The apparatus of claim 4, wherein:
   a fourth structure extends from the circuit board and is configured to shield the memory device, the components, or both from impact, and
   the fourth structure is positioned between the third edge of the circuit board and a fourth edge of the circuit board, wherein the fourth structure extends in a direction that extends from the first edge of the circuit board to the second edge of the circuit board, and wherein a portion of the circuit board is stiffened based at least in part on a position of the fourth structure.

6. The apparatus of claim 1, wherein a height of the structure is greater than or equal to a height of the memory device, the components for accessing the memory device, or both, based at least in part on building up a laminate layer in the third area.

7. The apparatus of claim 1, wherein:
   a second structure extends from the circuit board and is configured to shield the memory device, the components, or both from impact, and
   the apparatus further comprises a label connected to a top of the structure and a top of the second structure, the label covering at least a portion of the memory device, at least a portion of the components for accessing the memory device, or both.

8. The apparatus of claim 7, wherein:
   the label comprises an electrically-conductive material, a thermally-conductive material, or both.

9. The apparatus of claim 7, wherein:
   the label comprises one or more protrusions configured to dissipate thermal energy generated by the memory device, thermal energy generated by the components for accessing the memory device, or both.

10. The apparatus of claim 7, wherein:
    the label comprises a first thermally-conductive material, and
    the structure comprises a second thermally-conductive material, wherein the first thermally-conductive material of the label is coupled with the second thermally-conductive material of the structure based at least in part on the label being connected to the top of the structure, and wherein the second thermally-conductive material of the structure is configured to dissipate thermal energy generated by the memory device, thermal energy generated by the components for accessing the memory device, or both.

11. The apparatus of claim 1, wherein:
    the structure comprises at least a portion of the circuit board formed by an integrally-formed layer of laminate material.

12. The apparatus of claim 1, wherein:
the structure is composed of an insulative material and is attached to the circuit board via one or more first pins of the structure that are soldered to the circuit board, via one or more second pins of the structure that are press-fit into receiving holes of the circuit board, via one or more screws that pass through the structure and are screwed into or bolted to the circuit board, via one or more jacks that are plugged into one or more plugs that are coupled with the circuit board, or any combination thereof.

13. The apparatus of claim 1, wherein:
the structure comprises an insulative material comprising a first stiffness and a second material that is at least partially encapsulated by the insulative material and comprising a second stiffness greater than the first stiffness; and
the structure, the circuit board, or both, are stiffened by the second material.

14. The apparatus of claim 1, wherein:
the structure comprises a plurality of substructures that are detachably connected to one another to form the structure.

15. The apparatus of claim 14, wherein the plurality of substructures comprises:
a first set of substructures configured to form a first portion of a wall; and
a second set of substructures configured to form a second portion of the wall and a covering that extends orthogonally from the wall.

16. The apparatus of claim 1, wherein:
a portion of the structure extends over a component of the components, the portion of the structure configured to protect the component from impact.

17. The apparatus of claim 1, further comprising:
a case that encapsulates the circuit board, the memory device, the components for accessing the memory device, and the structure.

18. A method of manufacture, comprising:
forming a circuit board that comprises a first area for a memory device and a second area for a set of components associated with the memory device;
configuring a third area of the circuit board to support one or more structures for protecting the memory device, the set of components for accessing the memory device, or both, from impact; and
attaching, to the circuit board, the memory device in the first area and the set of components for accessing the memory device in the second area.

19. The method of manufacture of claim 18, wherein:
forming the circuit board comprises forming a laminate layer of the circuit board, wherein forming the laminate layer of the circuit board comprises building up the laminate layer in the third area to form the one or more structures.

20. The method of manufacture of claim 18, further comprising:
attaching, to the circuit board, the one or more structures in the third area.

21. The method of manufacture of claim 20, wherein attaching the one or more structures to the circuit board comprises:
guiding pins of the one or more structures through holes in a first side of the circuit board; and
soldering the pins to an opposite side of the circuit board.

22. An apparatus, comprising:
a circuit board;
a memory device coupled with the circuit board;
components for accessing the memory device that are coupled with the circuit board;
a first structure extending from the circuit board;
a second structure extending from the circuit board, wherein:
the circuit board comprises a first area for the memory device, a second area for the components for accessing the memory device, and a third area configured to support one or more structures for protecting the memory device, the components for accessing the memory device, or both, from impact, and
the memory device is positioned with the first area, the components for accessing the memory device are positioned within the second area, and the first structure and the second structure are positioned within the third area; and
a label coupled with the first structure and the second structure, wherein the label covers the memory device, the components for accessing the memory device, or both.

23. The apparatus of claim 22, further comprising:
a third structure extending from the circuit board; and
a fourth structure extending from the circuit board and opposing the third structure, wherein the label is coupled with the third structure and the fourth structure, and wherein the first structure, the second structure, the third structure, the fourth structure, and the label enclose the memory device and the components for accessing the memory device.

24. The apparatus of claim 23, further comprising:
a fifth structure extending from the circuit board, wherein the fifth structure extends in a direction that extends from the first structure to the second structure, the first structure opposing the second structure, wherein the fifth structure is positioned between the third structure and the fourth structure, and wherein a structural strength of an enclosure formed by the first structure, the second structure, the third structure, the fourth structure, and the label is increased by the fifth structure.

25. The apparatus of claim 22, wherein:
a height of the first structure and a height of the second structure exceeds a height of the memory device and heights of the components.

* * * * *